(12) United States Patent
Adams et al.

(10) Patent No.: US 7,126,500 B2
(45) Date of Patent: Oct. 24, 2006

(54) METHOD AND SYSTEM FOR SELECTING GRAMMAR SYMBOLS FOR VARIABLE LENGTH DATA COMPRESSORS

(75) Inventors: Stephen Robert Adams, Seattle, WA (US); Thomas Dee McGuire, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 848 days.

(21) Appl. No.: 10/180,260

(22) Filed: Jun. 26, 2002

(65) Prior Publication Data

US 2004/0001543 A1    Jan. 1, 2004

(51) Int. Cl.
*H03M 7/00* (2006.01)
(52) U.S. Cl. .............. 341/50; 341/51; 341/65; 341/67; 382/244
(58) Field of Classification Search ........ 375/240; 341/51, 95, 106, 50, 65, 67; 382/244
See application file for complete search history.

(56) References Cited

U.S. PATENT DOCUMENTS 5,666,114 A * 9/1997 Brodie et al. ............... 341/50
5,915,041 A    6/1999 Thielens
6,362,756 B1   3/2002 Shannon
2001/0038347 A1* 11/2001 Avery et al. ................ 341/51

OTHER PUBLICATIONS

S.R. Quackenbush and J.D. Johnston: AT&T Laboratories, 600 Mountain Avenue, Murray Hill, NJ 07974: *Noiseless Coding of Quantized Spectral Components in MPEG-2 Advanced Audio Coding*. pp. 1-4.
Huffman, David: Proceedings of the I.R.E; Sep. 1952; vol. 40, No. 9: *A Method for Construction of Minimum-Redundancy Codes*. pp. 1098-1101.
Plantinga, Harry: Department of Computer Science, University of Pittsburgh, Pittsburgh, PA 15260: *An Asymmetric, Semi-adaptive Text Compression Algorithms*. 7 pages.
J.W.J. Williams: Communications of the Association for Computing Machinery; Jun. 1964; vol. 7, No. 6: *Algorithms*. pp. 347-348.

* cited by examiner

*Primary Examiner*—Jay K. Patel
*Assistant Examiner*—Adolf DSouza
(74) *Attorney, Agent, or Firm*—Merchant & Gould P.C.

(57) ABSTRACT

A data compression method and system replaces pairs of symbols in a string of symbols by a single new symbol. A method for selecting the pairs of symbols to be replaced employs a modified greedy algorithm. The method selects a next best pair of symbols for replacement by considering pairs that have a potential for usurping a current best candidate pair of symbols, due to their frequency of occurrence. A minimum savings threshold is evaluated to further avoid exhaustive searches of all possible pairs of symbols.

25 Claims, 5 Drawing Sheets

METHOD AND SYSTEM FOR SELECTING GRAMMAR SYMBOLS FOR VARIABLE LENGTH DATA COMPRESSORS

FIELD OF THE INVENTION

The present invention relates generally to data compression, and more particularly to a system and method for selecting grammar symbols for variable length data compressors.

BACKGROUND OF THE INVENTION

Many of today's computing applications require storage of large volumes of data, and the number of such applications is constantly increasing as the use of computers extends to new disciplines. Moreover, the proliferation of computer communication networks is resulting in massive transfer of data over communication links. Reducing costs associated with the storage and communication of data may be obtained through data compression techniques.

A simple characterization of data compression involves transforming or encoding a string of symbols in one representation, such as ASCII, into another string (sometimes called codewords) which may contain the same information as the original string, but whose length is smaller. The aim of data compression is to reduce redundancy in the original string of symbols, and thereby increase effective data density.

A variety of data compression techniques exists today. Such data compression techniques may be categorized as block-block, block-variable, variable-block, or variable-variable. Block-block indicates that the original string of characters and the resulting codewords are of fixed length. Variable-variable data compression techniques encode original strings of symbols of variable-length into variable-length codewords. Huffman coding is one example of a variable-variable data compression technique.

A Huffman encoder typically uses a Huffman statistical model to encode a string of symbols into a series of variable length codewords. The Huffman encoder operates to assign short codewords to symbols in the string that occur most often and longer codewords to the symbols in the string that occur the least often. The construction of Huffman codes is further described in an article by David Huffman, entitled "A Method for the Construction of Minimum Redundancy Codes" in the proceedings of the I. R. E., volume 40, pages 1098–1101, 1952.

While prior art data compression techniques have proven useful, new data compression techniques are always needed in order to reduce storage requirements of computing systems further as well as to improve the speed at which data may be communicated. Thus, it is with respect to these considerations and others that the present invention has been made.

SUMMARY OF THE INVENTION

This summary of the invention section is intended to introduce the reader to aspects of the invention. Particular aspects of the invention are pointed out in other sections herein below, and the invention is set forth in the appended claims, which alone demarcate its scope.

The present invention provides a system and method for data compression by replacing sequences of grammar symbols in a string of grammar symbols by a single new symbol. Selection of the sequences of grammar symbols to be replaced employs a modified greedy algorithm. The method selects a next best sequence of grammar symbols for replacement by considering sequences that have a potential for usurping a current best candidate sequence of symbols, due to their frequency of occurrence. A minimum savings threshold is evaluated to avoid exhaustive searches of all possible sequences of symbols.

In one aspect of the present invention, a computer-readable medium that has computer executable instructions for compressing symbols in a string of symbols generates sequences of symbols from the string of symbols. The sequences of symbols are ordered according to an associated frequency of occurrence in the string of symbols. The computer executable instructions also perform the step of selecting a current candidate replacement sequence from the ordered sequences of symbols. The selection is achieved by determining a target cost savings and a minimum frequency of occurrence associated with the current candidate replacement sequence. Then for other sequences of symbols in the ordered sequence of symbols having an associated frequency of occurrence that is greater than the minimum frequency of occurrence, the computer executable instructions identify an alternative candidate replacement sequence, where the identified alternative candidate sequence has an associated cost savings that is greater than the target cost savings, and replaces the identified alternative candidate replacement sequence in the string of symbols by a single symbol.

In a further aspect of the computer-readable medium, the computer executable instructions repeat the executable instructions until a predetermined minimum threshold is achieved. In still a further aspect of the computer-readable medium, the predetermined minimum threshold is determined to include at least a sum of bits to encode a grammar rule and the single symbol.

In accordance with another aspect of the present invention, a computer-readable medium having computer executable components for compressing symbols in a string of symbols includes a symbol sequence picker. The symbol sequence picker is configured to generate sequences of symbols from the string of symbols, wherein the sequences of symbols are ordered according to an associated frequency of occurrence in the string of symbols, and select a current candidate replacement sequence from the ordered sequences of symbols. The current candidate replacement sequence is selected by determining a target cost savings and a minimum frequency of occurrence associated with the current candidate replacement sequence. For other sequences of symbols in the ordered sequence of symbols having an associated frequency of occurrence that is greater than the minimum frequency of occurrence, the symbol sequence picker identifies an alternative candidate replacement sequence with an associated cost savings that is greater than the target cost savings, and replaces the identified alternative candidate replacement sequence in the string of symbols by a single symbol.

In a further aspect of the computer-readable medium, the symbol sequence picker is further configured to repeat the executable instructions until a predetermined minimum threshold is achieved.

In accordance with still another aspect of the present invention, a computer-implemented method for transmitting a compressed data file is described, that includes building a list of decompression information that has relevance to each of a plurality of strings of symbols, and transmitting the list of decompression information in conjunction with a request for at least one of the plurality of strings of symbols.

In accordance with yet another aspect of the present invention, a computer-readable medium is encoded with a data structure for use in communicating a compressed file. The data structure includes a plurality of compressed files, where at least two of files in the plurality of compressed files have a symbol representing a sequence of symbols. The data structure further includes a shared information header that includes a grammar rule for use in decompressing each of the plurality of compressed files. The grammar rule is a mapping of the symbol to the sequence of symbols.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description of the Invention, which is to be read in association with the accompanying drawings, wherein.

DETAILED DESCRIPTION OF THE PREFERRED EMBODIMENT

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification, the term "connected" means a direct connection between the things that are connected, without any intermediary devices or components. The term "coupled," means a direct connection between the things that are connected, or an indirect connection through one or more either passive or active intermediary devices or components. The term "circuit" means one or more passive and/or active components that are arranged to cooperate with one another to provide a desired function. The term "signal" means at least one current signal, voltage signal, or data signal. The meaning of "a," "an," and "the" include plural references. The meaning of "in" includes "in" and "on."

Briefly stated, the present invention provides a system and method for data compression by replacing pairs of grammar symbols in a string of grammar symbols in a message by a single new symbol. The system and method select sequences of grammar symbols for replacement by considering those sequences of grammar symbols that due to their frequency of occurrence in a file or set of files have a potential for usurping a current best candidate sequence of grammar symbols. After replacement of the sequences of grammar symbols in the file(s), a variable-variable encoder, such as the Huffman encoder, is employed to further compress the string of grammar symbols.

Illustrative Environment

Figure 1:
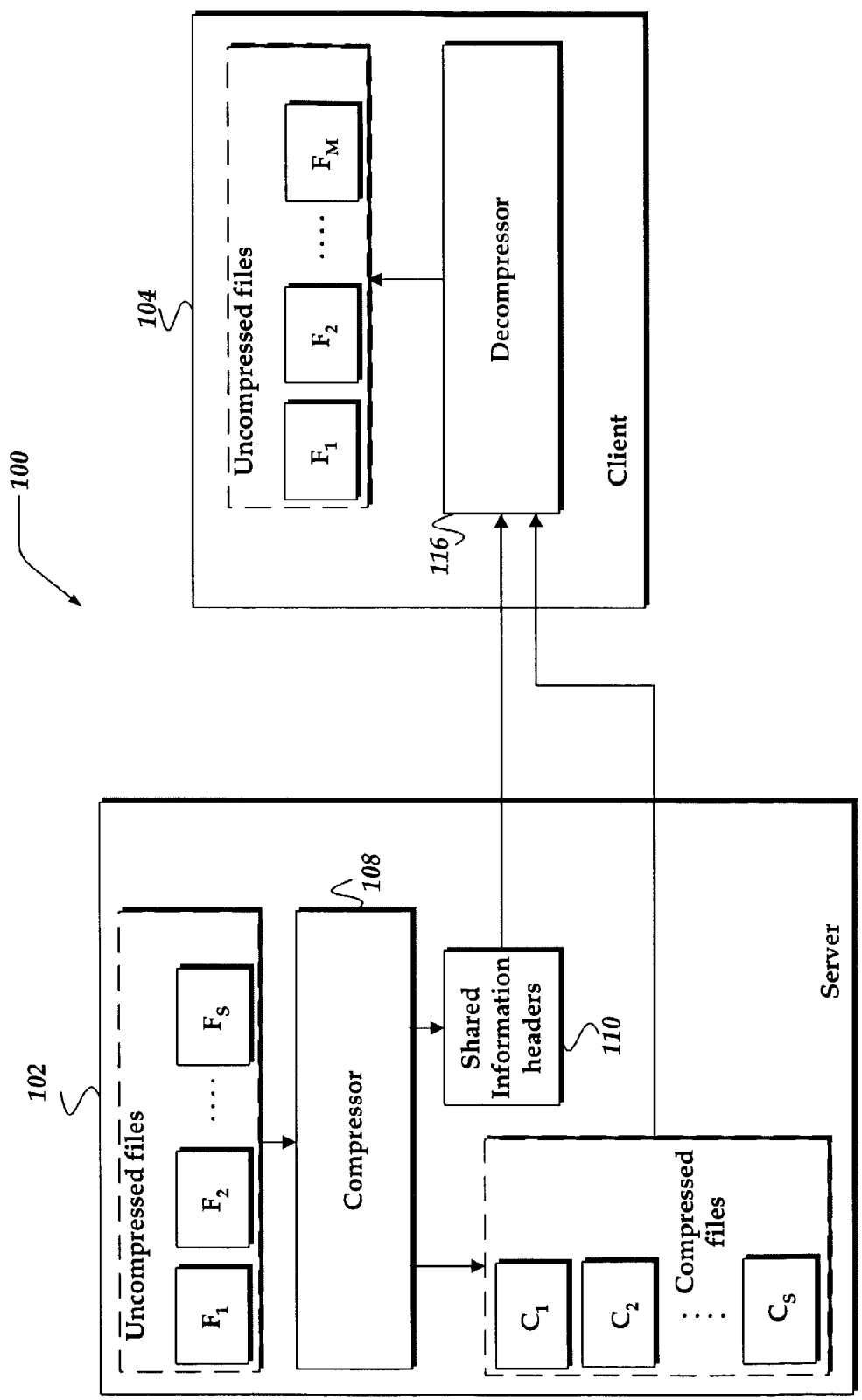
FIG. 1 illustrates a functional block diagram of one embodiment of a computing system incorporating data compressor/decompressors.

FIG. 1 illustrates a functional block diagram of one embodiment of a computing system incorporating data compressor/decompressors, in accordance with the present invention.

As shown in the figure, computing system 100 includes sever 102, and client 104. Server 102 includes uncompressed files $F_1$–$F_S$, compressor 108, shared information headers 110, and compressed files $C_1$–$C_S$. Client 104 includes uncompressed files $F_1$–$F_M$, and decompressor 116.

Compressor 108 is in communication with uncompressed files $F_1$–$F_S$. Compressor 108 is also in communication with compressed files $C_1$–$C_S$, and shared information headers 110. Decompressor 116 in client 104 is in communication with uncompressed files $F_1$–$F_M$. Decompressor 116 in client 104 is also in communication with server 102 to receive shared information headers 110 and compressed files $C_1$–$C_S$.

Server 102 is described in more detail with reference to FIG. 2 below. Briefly, however, server 102 includes any computing device that is configured to provide services, such as World Wide Web, ftp, email, dialup, and the like over a communications infrastructure. Moreover, server 102 may include applications, databases, compressed files $C_1$–$C_S$, shared information headers 110, and the like that client 104 may seek to access.

Client 104 includes any device capable of sending information to or receiving information from server 102. Client 104 includes personal computers, multiprocessor systems, microprocessor-based or programmable consumer electronics, network PCs, minicomputers, mainframe computers, and the like.

Uncompressed files $F_1$–$F_S$ are a set of independently compressible data files. Uncompressed files $F_1$–$F_S$ include collections of textual or binary symbols typically arranged to provide information. Redundancy of symbols may exist within a single file within uncompressed files $F_1$–$F_S$, or across the set of uncompressed files $F_1$–$F_S$.

Uncompressed files $F_1$–$F_S$ may represent subroutines or functions from a larger computer program. The subroutines in turn may include executable instructions comprising grammar symbols. Grammar symbols include alphanumeric character strings as well as characters such as "&, +, |," and the like typically employed in computer programming languages (for brevity and readability, henceforth, the term symbol includes grammar symbols). Such symbols may be redundant across the set of uncompressed files $F_1$–$F_S$. Moreover, symbols or collections of grammar symbols may be redundant within a single file within the set of uncompressed files $F_1$–$F_S$.

Uncompressed files $F_1$–$F_S$ also may represent sections from a larger document file, such as an electronic-book. The uncompressed files $F_1$–$F_S$ may be sentences, paragraphs, or chapters within the electronic-book. As is apparent, symbol redundancy of symbols may exist within the sentences, as well as across the chapters.

For the purposes of the present invention, a structure or format in which the symbols are stored typically is not relevant. Thus, uncompressed files $F_1$–$F_S$ may be stored on a computing device, such as server 102, as ASCII characters, in a proprietary file structure, or the like, without departing from the scope or spirit of the invention.

Compressed files $C_1$–$C_S$ is a set of data-compressed files corresponding to uncompressed files $F_1$–$F_S$. More specifically, compressed file $C_1$ is associated with uncompressed file $F_1$, compressed file $C_2$ is associated with uncompressed file $F_2$, and so forth. Furthermore, compressed files $C_1$–$C_S$ include collections of textual or binary symbols where the redundancy in uncompressed files $F_1$–$F_S$ is reduced.

Shared information headers 110 include information associated with how compressed files $C_1$–$C_S$ are compressed. For example, shared information headers 110 include information related to symbols that are replaced by compressor 108. Shared information headers 110 also include information about additional data compression techniques that are executed upon uncompressed files $F_1$–$F_S$ by compressor 108.

In one embodiment, shared information headers 110 include Huffman tree information that is common to the compressed files $C_1$–$C_S$. As such, the common Huffman tree information may be communicated to client 104 once in response to a request for any one or more of compressed files $C_1$–$C_S$, thereby improving the efficiency of data transfers.

Uncompressed files $F_1$–$F_M$ are substantially similar to uncompressed files $F_1$–$F_S$. However, uncompressed files $F_1$–$F_M$ may include the entire set of uncompressed files $F_1$–$F_S$ or a subset of uncompressed files $F_1$–$F_M$. That is, M may be less than or equal to S. Moreover, uncompressed files $F_1$–$F_M$ represents lossless data files in that uncompressed files $F_1$–$F_M$ are virtually exact replicas of the original subset of the uncompressed files $F_1$–$F_S$.

Figure 3:
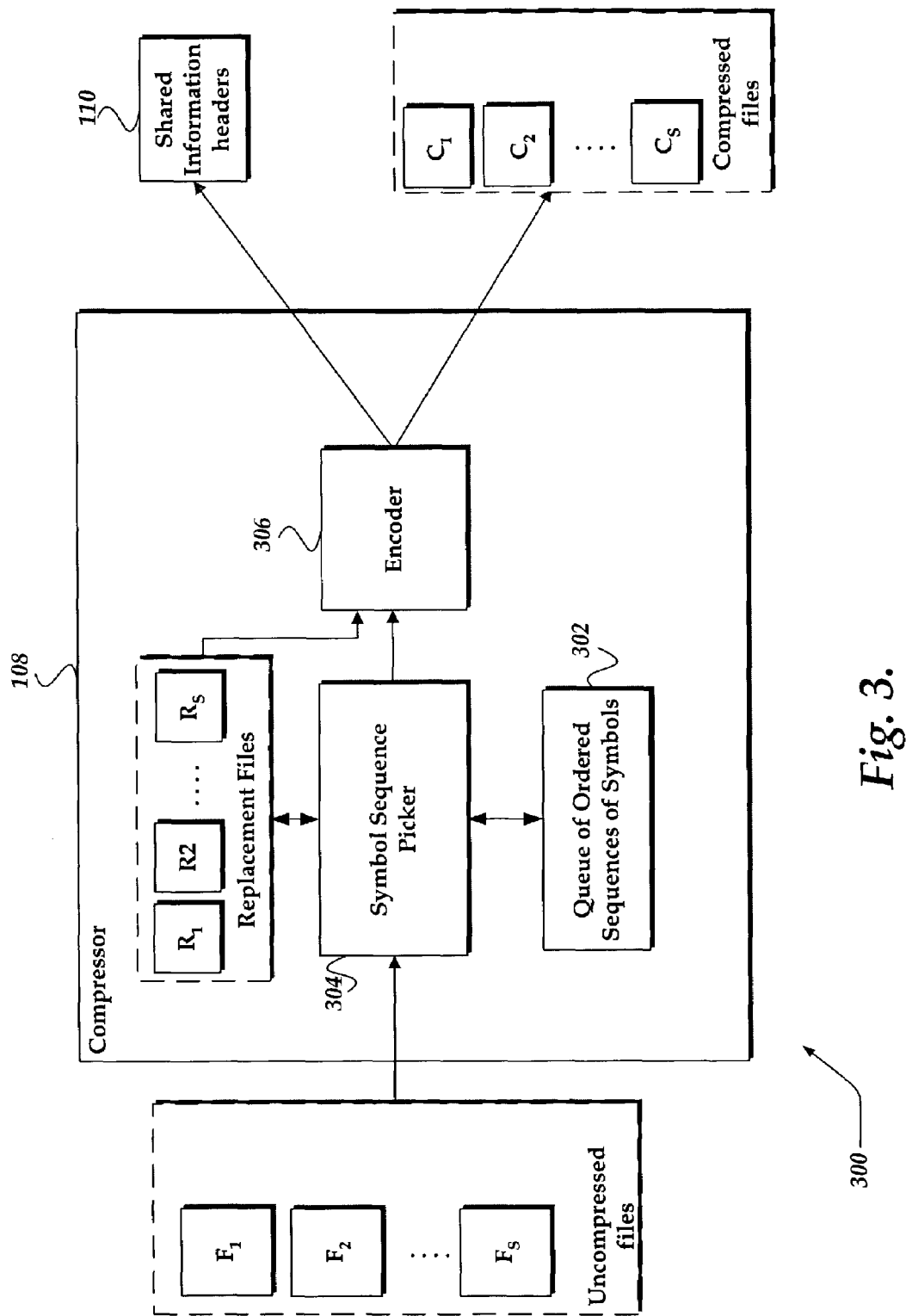
FIG. 3 is a functional block diagram of one embodiment of components of the data compressor illustrated in FIG. 2 for managing data compression.

Compressor 108 is described in more details in FIG. 3. Briefly, however, compressor 108 includes software and related hardware arranged to receive uncompressed files $F_1$–$F_S$, and provide compressed files $C_1$–$C_S$. Compressor 108 also provides shared information headers 110.

Decompressor 116 includes software and related hardware arranged to receive compressed files $C_1$–$C_S$, or a subset of compressed files $C_1$–$C_S$, along with shared information headers 110. Decompressor 116 employs information included in shared information headers 110 to provide uncompressed files $F_1$–$F_M$.

Figure 2:
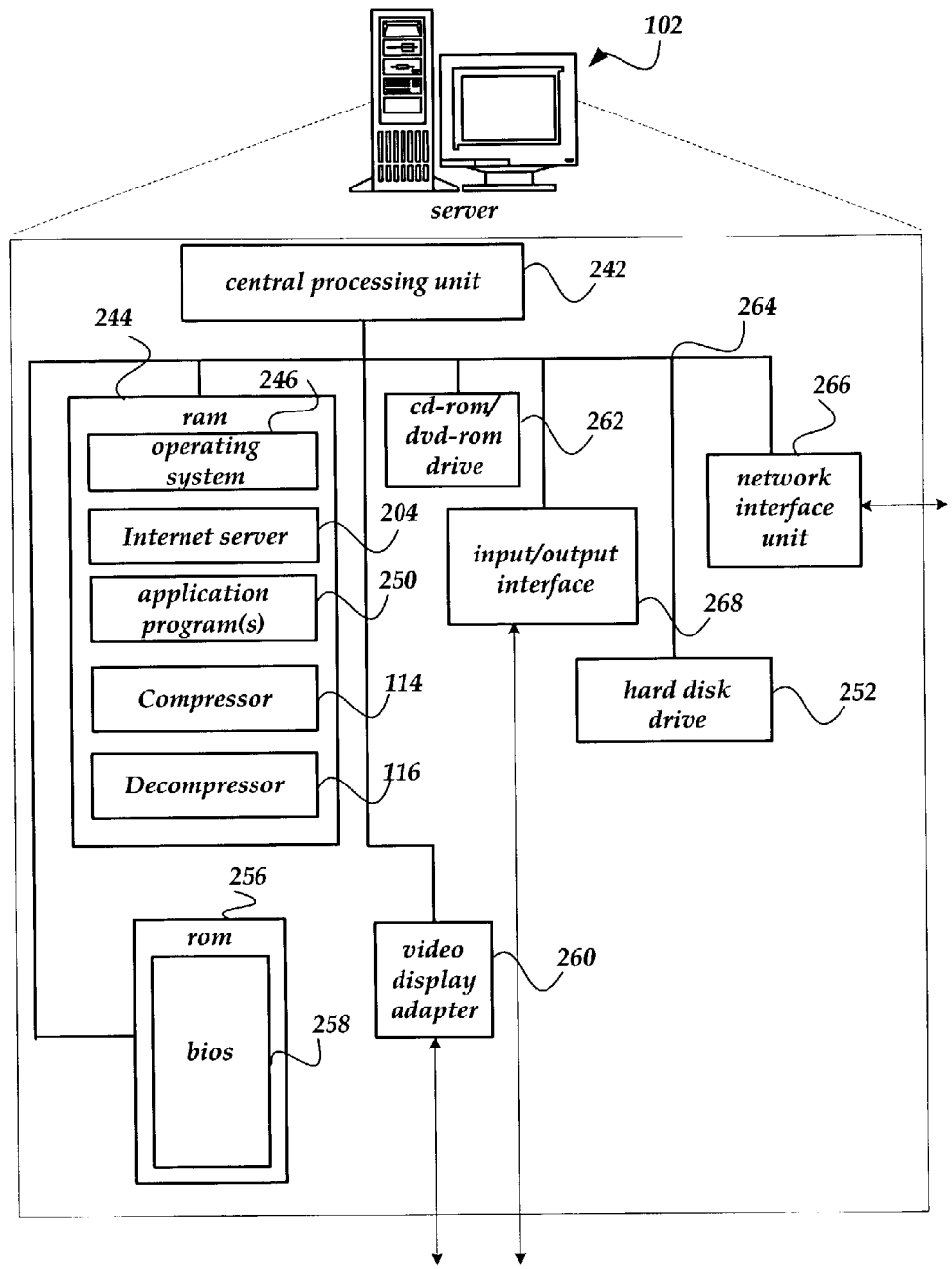
FIG. 2 is a functional block diagram illustrating an embodiment of an exemplary system for practicing the present invention.

FIG. 2 is a functional block diagram illustrating an embodiment of an exemplary system for practicing the present invention. Server 102 is configured to provide selected files from compressed files $C_1$–$C_S$ and shared information headers 110 (shown in FIG. 1) to client 104 upon request. The requests may be provided by application programs (not shown), which are executing on client 104. These transactions can take place over a network, such as the Internet, or some other type/combination of communications networks.

Server 102 may include many more components than those shown. As illustrated in FIG. 2, Server 102 can communicate with the Internet, or some other communications network, via network interface unit 266 that is constructed for use with various communication protocols including the TCP/IP protocol.

Server 102 also includes processing unit 242, video display adapter 260, and a mass memory, all in communication with each other via bus 264. The mass memory generally includes RAM 244, ROM 256, and one or more permanent mass storage devices, such as hard disk drive 252, tape drive, optical drive, and/or floppy disk drive. The mass memory stores operating system 246 for controlling the operation of Server 102. A general-purpose server operating system may be employed, e.g., UNIX, LINUX™, Microsoft WINDOWS NT®, or the like. Basic input/output system ("BIOS") 258 is also provided for controlling the low-level operation of Server 102.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tapes, magnetic disks storage or other magnetic storage devices, or any other medium which can be used to store the desired information and which can be accessed by a computing device.

The mass memory also stores program code and data for providing a presence on a network. More specifically, the mass memory stores application programs, data, and Internet server 204. These application programs include computer executable instructions which, when executed on Server 102, generate response messages and perform the logic described elsewhere in this specification. Server 102 also has other application programs 250, compressor 108, and (optionally) decompressor 116 that perform logical operations. Server 102 may also include an SMTP handler application for transmitting and receiving e-mail, an HTTP handler application for receiving and handing HTTP requests, and an HTTPS handler application for handling secure connections. The HTTPS handler application may initiate communication with an external security application or a credit card processing application for communicating with remote financial institutions in a secure fashion.

Server 102 also includes input/output interface 268 for communicating with external devices, such as a mouse, keyboard, scanner, or other input devices not shown in FIG. 2. Likewise, Server 102 may further include additional mass storage facilities such as CD-ROM/DVD-ROM drive 262 and hard disk drive 252. Hard disk drive 252 is utilized by server computer 102 to store, among other things, application programs, databases, and compressed and uncompressed data files.

As illustrated in FIG. 2, decompressor 116 may optionally reside within server 102. As such, in one embodiment, decompressor 116 may obtain compressed files $C_1$–$C_S$ from hard disk drive 252, CD-ROM/DVD-ROM drive 262, or the like, and provide uncompressed files $F_1$–$F_M$ to RAM 244, or the like, for use by application program(s) 250.

Although not illustrated, client 104 may be configured in a substantially similar way to server 102 shown in FIG. 2.

FIG. 3 is a functional block diagram of one embodiment of components of compressor 108 illustrated in FIG. 2 for managing data compression, in accordance with the present invention.

As shown in the figure, compressor 108 includes symbol sequence picker 304, a queue of ordered sequences of symbols 302, replacement files $R_1$-$R_S$, and encoder 306.

Symbol sequence picker 304 is in communications with encoder 306. Symbol sequence picker 304 is also in communications with the queue of ordered sequences of symbols 302, uncompressed files $F_1$-$F_S$, and replacement files $R_1$-$R_S$.

Symbol sequence picker 304 includes software components that are configured to receive uncompressed files $F_1$-$F_S$ and provide replacement files $R_1$-$R_S$ and compression information associated with replacement files $R_1$-$R_S$ to encoder 306.

Replacement files $R_1$-$R_S$ is a collection of files generated from uncompressed files $F_1$-$F_S$, where sequences of symbols are replaced by shorter sequences of symbols. That is, symbol sequence picker 304 is configured to consider N symbols, such as A, B, . . . taken from the set of grammar symbols associated with uncompressed files $F_1$-$F_S$, and employ a grammar rule X→AB to replace pairs of AB with a new symbol X. The result of the replacement from the grammar rule is represented by replacement files $R_1$-$R_S$.

Although the grammar rule X→AB is expressed as a replacement of pairs of symbols AB, the present invention is not so limited. For example, the grammar rule may be expressed as a replacement of sequences that include triplets, sentences, code instructions, paragraphs, or the like without departing from the spirit or scope of the invention.

Symbol sequence picker 304 maintains the queue of ordered sequences of symbols 302 as it evaluates potential sequences of symbols for replacement.

The queue of ordered sequences of symbols 302 includes sequences of symbols ordered according to their frequency of occurrence. The frequency of occurrence is initially based on information obtained from uncompressed files $F_1$-$F_S$ by symbol sequence picker 304. As symbol sequence picker 304 continues to operate, information about the frequency of occurrence of sequences of symbols is supplemented with information from replacement files $R_1$-$R_S$.

In one embodiment of the invention, the queue of ordered sequences of symbols 302 is a tree implementation based initially on the frequency of occurrence of the sequences of symbols in uncompressed files $F_1$-$F_S$. The higher frequency of occurrences is higher in the tree structure. Branches at the same level in the tree structure represent sequences of symbols having the same frequency of occurrence.

Encoder 306 includes software components that are configured to receive replacement files $R_1$-$R_S$ along with information about the replacements performed by symbol sequence picker 304, and to generate compressed files $C_1$-$C_S$, and shared information headers 110. Encoder 306 may employ a variety of variable-variable compression techniques to further compress replacement files $R_{1-RS}$. In one embodiment of the present invention, the Huffman encoder is employed. However, encoder 306 also may employ arithmetic algorithms, or similar entropy encoding algorithms, without departing from the spirit or scope of the invention.

Moreover, most compression techniques can be decomposed into two steps: modeling and coding. That is, a technique of replacing sequences of symbols with new symbols is modeling, while using encoders such as Huffman coding or arithmetic coding to convert the sequence of symbols to bits is coding. The modeling step of a traditional compressor can be employed to pre-process the input to the present invention, provided the output of the present invention is also post-processed by decompressor 116 in a similar approach. In practice, the sequence of symbol expansion and the 'post' processing step may be interleaved.

A Lempel-Ziv (LZ) style compressor may be employed by modeling a sequence of symbols as either literal symbols, which are passed through, or as copy of symbols, which mean that some part of the already output sequence is copied. For example, consider the input "lenience," which may be re-represented as l e n i copy-2-3 c e where e means output the symbol 'e', and copy-n-d means copy n symbols from d positions back in the output stream. Consider the following example where a set of words are compressed such that they may later be decompressed independently, and their LZ models:

| | |
|---|---|
| lenience | l e n i copy-2-3 c e |
| hanging | h a n g i copy-2-3 |
| consonance | c o n s copy-2-3 a n c e |

Notice that an and ce at the end of "consonance" cannot be re-represented as copy symbols without making the decompression dependent on the other strings.

Choosing sequences of symbols, a common header is obtained with three symbol replacements, along with transformed strings:

| |
|---|
| {X→c e, Y→a n, Z→i copy-2-3} |
| l e n Z X |
| h Y g Z |
| c o n S copy-2-3 Y X |

Generalized Operation

Figure 4:
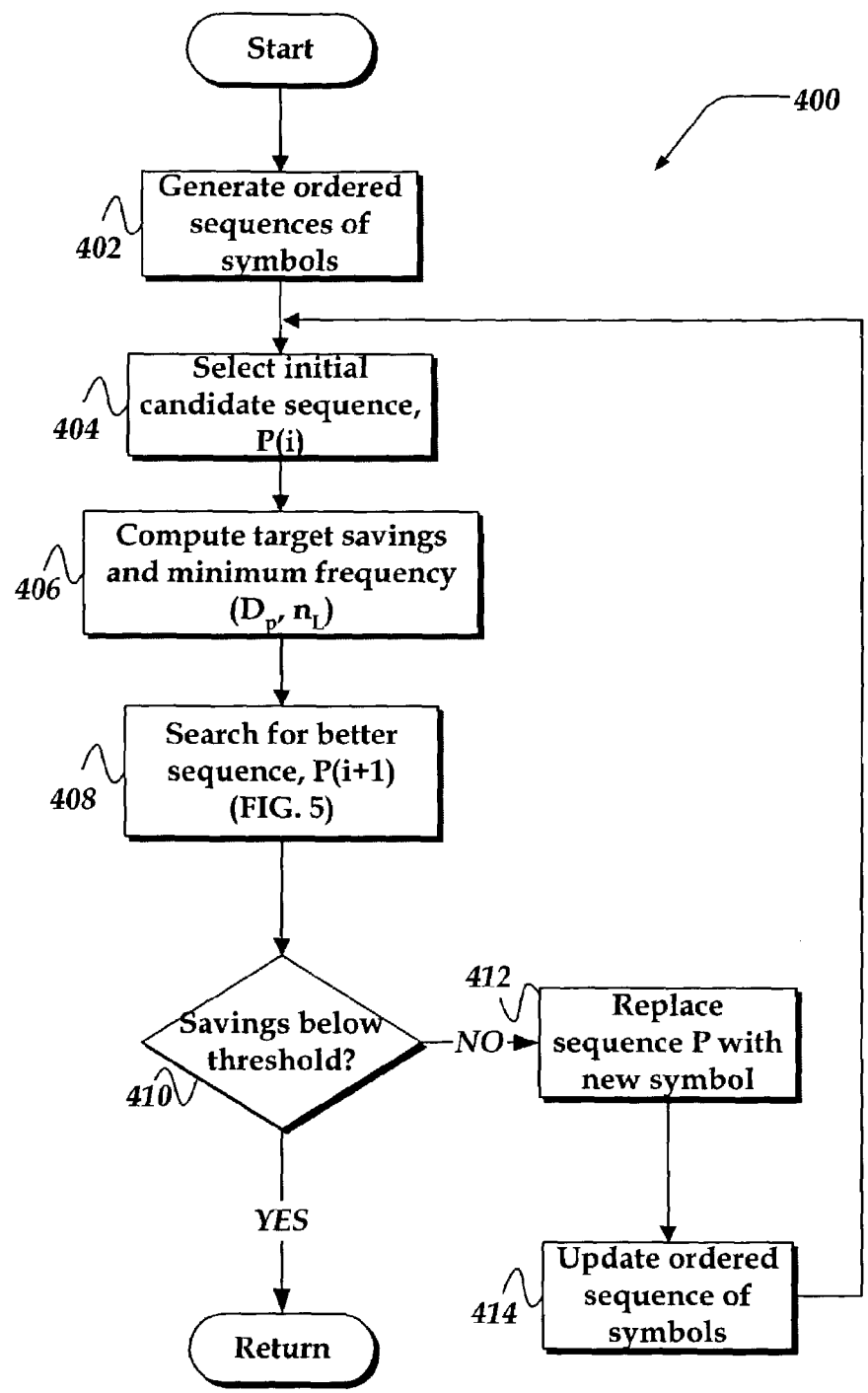
FIG. 4 is a flow diagram generally showing one embodiment of a process for selecting pairs of grammar symbols.
Figure 5:
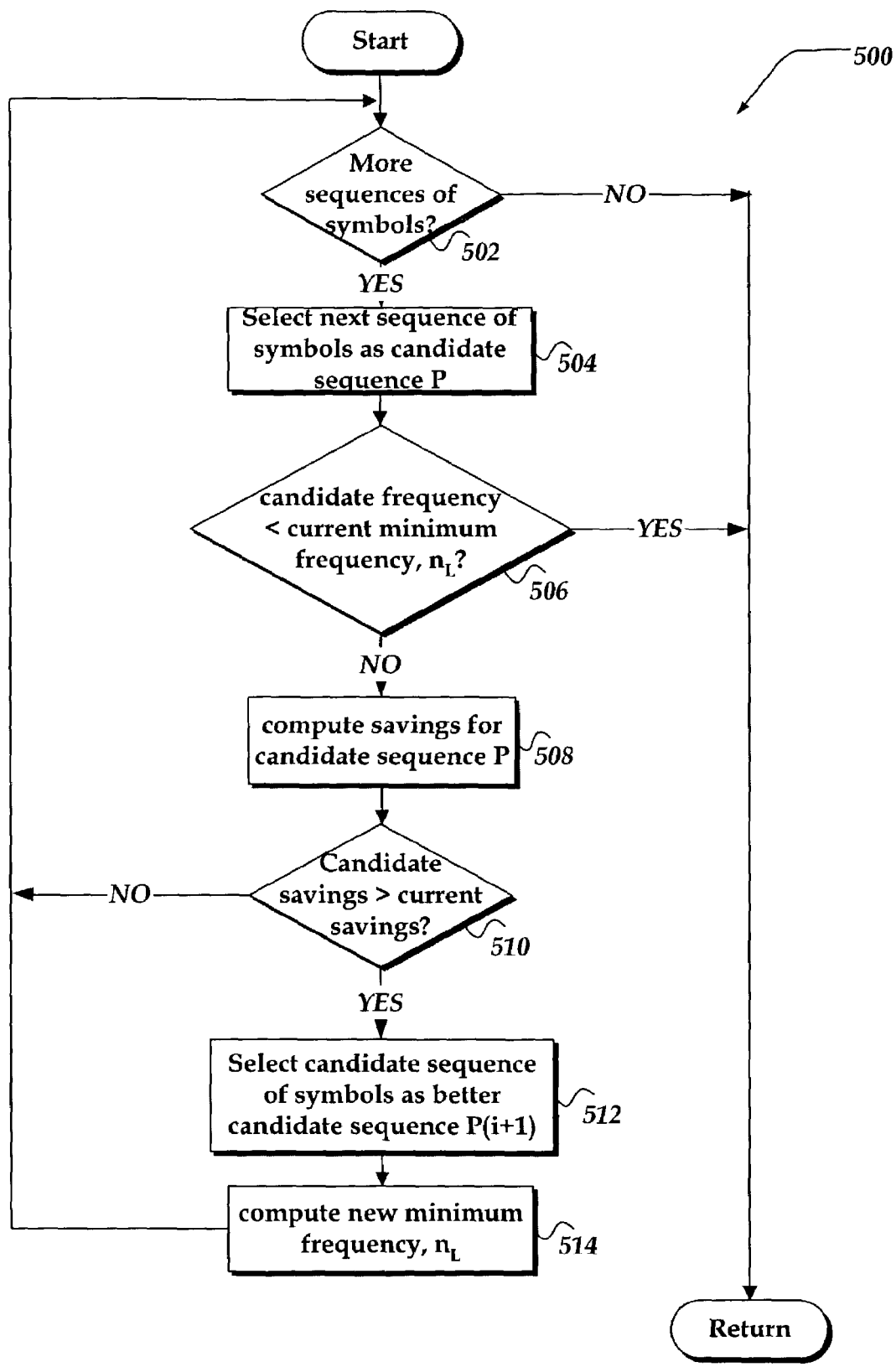
FIG. 5 is a flow diagram generally showing one embodiment of a process for iterating on candidates of pairs of grammar symbols, in accordance with the present invention.

FIGS. 4–5 are flow diagrams generally showing one embodiment of a process for selecting sequences of grammar symbols for use in data compression, in accordance with the present invention. Processes 400 and 500 of FIGS. 4–5 may be employed by compressor 108 illustrated in FIG. 3.

It will be understood that each block of the flowchart illustration, and combinations of blocks in the flowchart illustration, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor provide steps for implementing the actions specified in the flowchart block or blocks.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

FIG. 4 is a flow diagram generally showing one embodiment of a process for selecting sequences of grammar symbols, in accordance with the present invention. Briefly, grammar symbol process 400 considers sequences of symbols in order of decreasing frequency of occurrence. Employing a modified greedy algorithm, those alternative candidate sequences of symbols are evaluated that have a potential of usurping a current best candidate sequence of symbols. This is unlike a traditional algorithm that considers every possible sequence of symbols when selecting replacement symbols.

The current best candidate sequence of symbols is replaced with the alternative candidate sequences having a better total cost savings than the current best candidate sequence. To further avoid exhaustive searches for alternative candidate sequences with better total cost savings, a minimum threshold is also employed.

Grammar symbol process 400 begins, after a start block, at block 402, where an initial ordered sequence of symbols is generated. The initial ordered sequence is generated by evaluating uncompressed files, such as uncompressed files $F_1-F_S$ in FIG. 1. As sequences are identified, an associated frequency of occurrence, n, is computed for the identified sequence. For example, suppose the uncompressed files include the text phrase, "a bookworm eats books." The pairs of sequences, "space-b," "bo," "oo," and "ok," each have a frequency of occurrence of 2. The remaining pairs of sequences, such as "a-space," "kw," and the like each have a frequency of occurrence of 1.

At block 402, the identified sequences are ordered so that sequences with a higher frequency of occurrence are evaluated before lower frequency of occurrence sequences. In one embodiment, sequences with the same frequency of occurrence are ordered in a tree structure at the same level. In another embodiment, the sequences with the same frequency of occurrence are arbitrarily ordered. In yet another embodiment the identified pairs are ordered by inserting them in a "priority queue" also known as a "heap" as described in J. W. J. Williams, Communications of the Association for Computing Machinery, vol 7 (1964) 347–348.

In the example, an ordered tree structure includes two branches. A first branch includes pairs of sequences with a frequency of occurrence of 2, a second branch includes those sequences with a frequency of occurrence of 1.

Upon completion of block 402, the process proceeds to block 404, where a current candidate sequence P(i), is selected for replacement. In one embodiment of the present invention, the current candidate sequence P(i) is selected as the sequence with the highest frequency of occurrence. This is a reasonable initial candidate, as there is typically a correlation between frequency of occurrence of a sequence of symbols and its goodness for data compression. However, a total cost savings in data compression is determined by two measures: how frequently a cost savings may be achieved, and how much the cost savings is for a given sequence. Thus, a candidate sequence may occur infrequently, but yield a larger cost savings each time the sequence occurs.

Upon completion of block 404, the process continues next to block 406. At block 406, a target cost savings $D_p$ in bits is computed for current candidate sequence P(i). Target cost savings $D_p$ in bits is determined by:

$$DP = L - L' \qquad \text{eqn. 1}$$

where L is the length in bits of the uncompressed files $F_1-F_S$ without symbol replacement, and L' is the length in bits after symbol replacement. Target cost savings $D_p$ is determined by first noting that the number of bits required to encode all $n_A$ occurrences of a single symbol A is:

$$c(n_A, N) = -n_A * \log(n_A/N) \qquad \text{eqn. 2}$$

where N is the total number of symbols in uncompressed files $F_1-F_S$.

From equation 2, L, the length of bits without symbol replacement, is then:

$$L = c(n_A, N) + c(n_B, N) + \sum_{i \in S - \{A,B,X\}} c(n_i, N) \qquad \text{eqn. 3}$$

The length in bits after symbol replacement, L', is determined by application of the grammar rule X→AB. The new replacement files have $n_X = n_{AB}$ fewer symbols, where $n_X$ is the frequency of occurrence of replacement symbol X. With the number of As and Bs reduced, L' is:

$$L' = c(n_A - n_X, N - n_X) + c(n_B - n_X, N - n_X) + c(n_X, N - n_X) + \sum_{i \in S - \{A,B,X\}} c(n_i, N - n_X) \qquad \text{eqn. 4}$$

By appropriate substitution and simplification in equation 1, the target cost savings $D_p$ is:

$$D = L - L' = c(n_A, N) - c(n_A - n_X, N - n_X) + c(n_B, N) - c(n_B - n_X, N - n_X) - c(n_X, N - n_X) + (N - n_A - n_B - n_X) \log \frac{N}{N - n_X} \qquad \text{eqn. 5}$$

Given a particular candidate sequence pair, such as AB, it has been determined that the highest value for $D_p$ occurs when all the AB pairs are replaced and there are no A or B symbols remaining in uncompressed files $F_1-F_S$. That is $n_X = n_A = n_B$. By appropriate substitution in equation 5, the highest possible cost savings is:

$$D_X = c(n_X, N) + (N - 2 n_X) * \log(N/(N - n_X)) \qquad \text{eqn. 6}$$

At block 406, target cost savings $D_p$ is set to $D_x$ for the current candidate sequence P(i).

In addition, at block 406, a minimum frequency of occurrence $n_L$ is computed. Given the highest possible cost savings of $D_X$ bits, the minimum frequency of occurrence, $n_L = n_X$, between 0 and N/2, is solved numerically for which:

$$c(n_X, N) + (N - 2 n_X) * \log(N/(N - n_X)) > D_X \qquad \text{eqn. 7}$$

and X represents the current candidate sequence P(i).

Equation 7 may be solved by employing Newton's method, secant method, bisection method, or other numerical method for solving non-linear equations. In one embodiment, Newton's method is employed to solve for the minimum frequency of occurrence $n_L$.

The process then proceeds to block 408, where a search for an alternative better candidate sequence P(i+1) is conducted. Block 408 is described in more detail below in conjunction with FIG. 5. Briefly, however, at block 408, the ordered sequences of symbols are non-exhaustively iterated over in search for better candidate sequence P(i+1) based on a better candidate's frequency of occurrence and cost savings. If it is determined that better candidate sequence P(i+1)

exists, it replaces the current candidate sequence P(i). Upon completion of block 408, the process continues to decision block 410.

At decision block 410, a determination is made whether the current target cost savings $D_P$ is below a predetermined minimum threshold $D_M$. The predetermined minimum threshold $D_M$ may be selected to terminate grammar symbol process 400 based on a variety of criteria. For example, the predetermined minimum threshold $D_M$ may be selected to optimize the number of symbols that may fit within a bounded space, such as a TCP packet. The predetermined minimum threshold $D_M$ may also be selected to terminate grammar symbol process 400 after evaluation of a desired minimum number of sequences of symbols. However, it is recommended that predetermined minimum threshold $D_M$ be at least the number of bits necessary to store the grammar rule X→AB, otherwise, compressed files $C_1$–$C_S$ and shared information headers 110 of FIG. 1 are larger than without the replacement.

If, at decision block 410, it is determined that current target cost savings $D_P$ is below predetermined minimum threshold $D_M$, then it is determined that there are no more profitable sequences of symbols; the process returns to perform other actions.

Alternatively, if at decision block 410, it is determined that the current target cost savings $D_P$ is equal to or above predetermined minimum threshold $D_M$, the process proceeds to block 412.

At block 412, better candidate sequences of symbols P(i+1) are replaced in replacement files $F_1$–$F_S$ by the new symbol X. Recall that replacement files $R_1$–$R_S$ are initially generated from uncompressed files $F_1$–$F_S$. The process continues to block 414.

At block 414, the ordered sequences of symbols are updated to reflect the frequency of occurrences due to the replacement action performed at block 412. Evaluation of frequencies of occurrences is hereafter determined from replacement files $R_1$–$R_S$.

Updates to the frequencies of occurrences for the ordered sequences of symbols includes examination of sequences of symbols adjacent to the replaced new symbol X. For example, given "A bookworm eats books," if it is determined that "oo" is replaced by the new symbol X, the replaced phrase appears as "A bXkworm eats bXks." To update frequencies of occurrences, the invention need only examine the sequences of symbols adjacent to the replacement. That is, in this example, the invention examines "bX," and "Xk," to increment associated frequencies of occurrence. Moreover, the frequencies of occurrence associated with "bo," and "ok" are decremented. In this manner, the entire ordered sequences of symbols need not be examined, thereby reducing overall data compression time.

Additionally, at block 414, as the frequencies of occurrence are adjusted, a position associated with a sequence of symbols in the ordered sequences of symbols is also adjusted. In one embodiment of the present invention, these adjustments in positions are obtained by employing an array representation of a "heap" (J. W. J Williams 1964). An index for each sequence of symbols is maintained with the sequence so that the position of the sequence in the array is directly obtained. Incremental adjustments of the sequences of symbols are accomplished by performing a sift-up or sift-down type of operation after an increment or a decrement of an associated frequency of occurrence.

Upon completion of block 414, the process returns to block 404 to perform substantially the same actions as described above.

FIG. 5 is a flow diagram generally showing one embodiment of a process for iterating on candidates of sequences of grammar symbols, as described briefly above at block 408 in FIG. 4. Briefly, iteration on candidates' process 500 non-exhaustively iterates over the ordered sequences of symbols in search for better candidate sequence P(i+1) based on a candidate's frequency of occurrence and cost savings. The process begins, after a start block, at decision block 502 where a determination is made whether there are any more sequences of symbols to examine in the ordered sequences of symbols. If it is determined that there are no more sequences of symbols to examine, the process returns to decision block 410 of FIG. 4, to perform other actions.

Alternatively, if it is determined that there are more sequences of symbols to examine, the process proceeds to block 504. At block 504, the next sequence of symbols in the ordered sequences of symbols is selected as a candidate sequence P. As described above at block 402 in FIG. 4, the sequences of symbols are ordered by decreasing frequency of occurrence. The process then proceeds to decision block 506.

At decision block 506, a determination is made whether the candidate sequence P has a frequency of occurrence that is less than the current minimum frequency of occurrence $n_L$. If it is determined that the candidate frequency of occurrence is less the current minimum frequency of occurrence $n_L$, the process returns to decision block 410 of FIG. 4, to perform other actions. Because the sequences are chosen at block 504 in order of decreasing frequency, there can remain no sequences of symbols that may have a higher frequency of occurrence than the current minimum frequency of occurrence $n_L$.

Alternatively, if at block 506, it is determined that the candidate sequence has a frequency of occurrence that is equal to or greater than the current minimum frequency of occurrence $n_L$ the process proceeds to block 508.

At block 508, a candidate cost savings is determined for the candidate sequence P by employing equation 5. Upon completion of block 508, the process continues to decision block 510.

At decision block 510 a determination is made whether the candidate cost savings is greater than current target cost savings $D_p$ associated with the current sequence P(i). If it is determined that the candidate cost savings is greater than current target cost savings $D_p$, then the process proceeds to block 512, where the candidate sequence P is selected as the better candidate sequence P(i+1). That is, the candidate sequence replaces the current sequence as the new current sequence in the iteration process. The process proceeds to block 514.

At block 514, a new minimum frequency of occurrence $n_L$ is computed for the new current sequence, employing equation 7 above. Upon completion of block 514, the process returns to decision block 502 to perform substantially the same actions as described above.

Segregation of Rules by Pattern

In accordance with another embodiment, the grammar rules may be segregated by pattern to further improve the compression of sequences of symbols. For instance, it is noted that grammar rule X→AB and grammar rule X→AA have different patterns. The grammar X→AB rule has two dissimilar symbols in the generated sequence, whereas the grammar rule X→AA has two similar symbols (a double symbol AA).

Both patterns, X→AB and X→AA may be employed, by tracking double symbols (AA) distinct from other sequences of symbols (AB). This may be accomplished by modifying the above descriptions so as to maintain for each pattern a separate queue of ordered sequences that conform to the pattern. Also a separate minimum frequency of occurrence, $n_L$, is maintained for each queue (pattern) to enable each pattern to have a different equation governing its $n_L$. Equation 7 is used for the pattern of two dissimilar symbols X→AB. A new equation is derived below for the case of two similar symbols.

Consider the replacement of AA by X according to grammar rule X→AA. The new replacement files have $n_x=n_{AA}$ fewer symbols, where $n_x$ is the frequency of occurrence of replacement symbol X. The number of A symbols will be reduced by 2 $n_x$. With the number of A symbols reduced, L', the length in bits after replacement, is:

$$L' = c(n_A - 2n_X, N - n_X) + c(n_X, N - n_X) + \sum_{i \in S-\{A,X\}} c(n_i, N - n_X)$$ eqn. 8

By appropriate substitution and simplification in equation 1, the target cost savings $D_P$ is:

$$D = L - L' = c(n_A, N) - c(n_A - 2n_X, N - n_X) - c(n_X, N - n_X) + (N - n_A - n_X)\log\frac{N}{N - n_X}$$ eqn. 9

Given a particular candidate sequence pair, such as AA, it has been determined that the highest value for $D_p$ occurs when all the AA pairs are replaced and there are no A symbols remaining in uncompressed files $F_1$–$F_S$. That is $n_X=2n_A$. By appropriate substitution in equation 9, the highest possible cost savings is:

$$D_X = c(n_X, N) - c(n_X, N - n_X) + (N - 3n_X)*\log(N/(N - n_X))$$ eqn. 10

In addition, at block 406 and block 514 a minimum frequency of occurrence $n_L$ is computed. Given the highest possible cost savings of $D_X$ bits, the minimum frequency of occurrence, $n_L=n_X$, between 0 and N/2, is solved numerically for which:

$$c(n_X, N) - c(n_X, N - n_X) + (N - 3n_X)*\log(N/(N - n_X)) > D_X$$ eqn. 11

In one embodiment, block 408 is changed to apply the process in FIG. 5 to each pattern in turn. For example, searching for a better replacement among doubles (X→AA) first and then searching among non-doubles (X→AB). In another embodiment, the process in FIG. 5 is modified to consider all the patterns together, considering the candidates from different patterns in some interleaved fashion.

Illustrative Example

An illustrative example of a generalized operation of the above-described embodiment of the present invention is provided next.

Consider an application that needs to compress words such that the words may be uncompressed in any order. The words may reside within a single uncompressed file $F_1$, or multiple uncompressed files $F_1$–$F_5$. For this example, the words comprise only lower case letters and sequences of symbols are replaced with fresh symbols taken from an upper case alphabet. As is illustrated by the example, the number of sequences-of symbols considered while searching for the best sequence of symbols to replace with one symbol is greatly reduced. Given the following file(s):

| |
|---|
| squire |
| quality |
| enquire |
| mire |
| realty |

There are a total of 30 symbols in five items (e.g., words). There are 16 distinct pairs (sequences); the most common sequence of symbols is sequence re, which occurs four times. Since each item is a separate entity, sequences that have the first symbol from one word and the second from the next word are not included. Thus, sequence eq (from squire quality) is not counted as a sequence of symbols (a symbol pair).

Coding the symbols squirequalityenquiremirerealty and using an ideal non-adaptive zeroth order entropy encoder, as known to one of ordinary skill in the art, the message is encoded in 102.087 bits.

| Symbol | Frequency | Bits/symbol | Coding bits (by eqn 1) |
|---|---|---|---|
| a | 2 | 3.90689 | 7.8138 |
| e | 5 | 2.58496 | 12.9248 |
| i | 4 | 2.90689 | 11.6276 |
| l | 2 | 3.90689 | 7.8138 |
| m | 1 | 4.90689 | 4.9069 |
| n | 1 | 4.90689 | 4.9069 |
| q | 3 | 3.32193 | 9.9658 |
| r | 4 | 2.90689 | 11.6276 |
| s | 1 | 4.90689 | 4.9069 |
| t | 2 | 3.90689 | 7.8138 |
| u | 3 | 3.32193 | 9.9658 |
| y | 2 | 3.90689 | 7.8138 |
| | | | 102.0873 |

As described at block 402 of FIG. 4, the ordered sequences of symbols are generated (in decreasing order of frequency of occurrences) as:

re (4)

ir qu (3)

al ty ui (2)

ea en it li lt mi nq sq ua (1).

An initial candidate sequence P(i) is selected as sequence re. Then employing equation 5 above (see block 406 of FIG. 4) a target cost savings is computed of about $D_{re}=12.5598$.

Noting that N=30 symbols, and solving equation 7 for D and trial values of $n_X$ the following table may be generated.

| $n_x$ | D |
|---|---|
| 0 | 0.0000 |
| 1 | 6.2764 |
| 2 | 10.4017 |
| 3 | 13.6139 |
| 4 | 16.1695 |

From this it may be determined that any sequence AB that reduced the encoded length to fewer bits than sequence re has at least three occurrences ($n_{AB} \geq 3$) because the highest number of bits that can be saved by introducing a new symbol for a sequence with just two occurrences is 10.4017.

This is less than the saving achieved by sequence re. Thus, all sequences of symbols that occur fewer than three times may be discounted, i.e. all sequences of symbols, except qu and ir. This avoids a need for exhaustively searching all possible sequences of symbols.

Next candidate sequence ir is considered. The cost savings for sequence ir is $D_{ir}=7.12363$ (by equation 5 above). Since this is not better than the previous best sequence $D_{re}=12.5598$, sequence re is retained.

Next, candidate sequence qu is considered. From equation 7 above, $D_{qu}=13.6139$. This improves on the previous best sequence's cost savings, $D_{re}=12.5598$. Therefore, the current candidate sequence is replaced by sequence qu.

Re-solving equation 7, it is found that a sequence of symbols must occur at least three times to be better that of sequence qu. Actually, a sequence of symbols must occur at least four times to be better that of sequence qu, since there are no other occurrences of q or u. However, as a practical issue, employing floating point numbers is inexact and may introduce inaccuracies that may lead to concluding either $n_{AB}=3$ or $n_{AB}=4$.

All the remaining candidate sequences occur two or fewer times. Therefore, the search for the best replacement sequence of symbols is complete.

Grammar rule X→QU is employed to replace a new symbol X for sequence qu, as described above in conjunction with block 412 of FIG. 4.

The new replacement files are:

| {X→qu} |
|---|
| sXire |
| Xality |
| enXire |
| mire |
| realty |

If the process is terminated now, the string sXireXality-enXiremirerealty may be encoded in 88.0174 bits.

However, continuing the flow of FIG. 4 from block 414 to block 404, sequence re is considered next as the new initial candidate sequence.

Applying a second iteration of the process described in conjunction with FIG. 4, the target cost savings associated with sequence re is found as $D_{re}=11.8051$. Note that $D_{re}$ has a value that is different from the first iteration, even though the first iteration replacement of sequence qu is independent of sequence re. This is because after replacement, the parameter N has changed from 30 to 27. The fact that making a replacement changes the savings attainable from all the candidate sequences is what makes other approaches, such as optimal symbol replacement, expensive to compute and why the computational savings from the present invention allows symbol replacement to be more feasible for a wider range of applications.

Proceeding, as above, sequence re eliminates all candidate sequences of symbols that occur fewer than three times. The only other candidate sequence that occurs at least three times is sequence ir.

The cost savings for sequence ir is found as $D_{ir}=6.58798$, however; which is less that the target cost savings for sequence re. Thus, the second replacement, per a new grammar rule, is Y→re. The new candidate sequence Xi is eliminated because it occurs only twice.

The two best sequences of symbols have been selected by considering at a total of five sequences of symbols. Encoding the words with replacements of symbols X and Y requires 75.2870 bits.

| {X→qu, Y→re} |
|---|
| sXiY |
| Xality |
| enXiY |
| miY |
| Yty |

If the process is continued for this example, the performance is seen to degrade for subsequent sequences of symbols. This arises because few of the sequences of symbols have sufficient savings to eliminate many of the other candidates. In more traditional applications, where there are many thousands of items (or files) summing to several million sequences of symbols, the present invention may pick several hundred sequences of symbols and look at about 10 % of the candidate sequences of symbols.

A point discounted in the example above, is that the grammar rule X→QU saves about 13.6139 bits. However, the grammar rule also needs to be described to decompressor 116 of FIG. 1. There are two components: (1) it takes some bits to encode the grammar rule, and (2) some bits will be needed in the decoding tables to describe the coding of the new symbol X. If the costs of encoding of grammar rule X→QU exceed 13.6139 bits, in this example, then the replacement may not be beneficial. Therefore, these encoding costs may be employed to select the predetermined minimum threshold $D_M$ described above in conjunction with block 410 in FIG. 4.

The above specification, examples, and data provide a complete description of the manufacture and use of the composition of the invention. Since many embodiments of the invention can be made without departing from the spirit and scope of the invention, the invention resides in the claims hereinafter appended.

We claim:

1. A computer-readable medium having computer executable instructions for compressing symbols in a string of symbols, comprising:
   generating sequences of symbols from the string of symbols, wherein the sequences of symbols are ordered according to an associated frequency of occurrence of each sequence of symbols in the string of symbols;
   selecting a current candidate replacement sequence from the ordered sequences of symbols;
   determining a target cost savings and a minimum frequency of occurrence associated with the current candidate replacement sequence, the target cost savings being associated with a reduction in an encoded length in the string of symbols resulting from replacing the candidate replacement sequence with another symbol; and
   for other sequences of symbols in the ordered sequence of symbols having an associated frequency of occurrence that is greater than the minimum frequency of occurrence, performing actions including:
      identifying an alternative candidate replacement sequence, wherein the identified alternative candidate sequence has an associated cost savings that is greater than the target cost savings; and replacing the identified alternative candidate replacement sequence in the string of symbols by the other symbol.

2. The computer-readable medium of claim 1, further comprising distinguishing candidate replacement sequences based on segregating patterns of sequences of symbols in the string of symbols.

3. The computer-readable medium of claim 1, further comprising repeating the executable instructions until a predetermined minimum threshold is achieved.

4. The computer-readable medium of claim 3, wherein the predetermined minimum threshold is determined to include at least a sum of bits to encode a grammar rule and the other symbol.

5. The computer-readable medium of claim 1, wherein the sequence of symbols are re-ordered by examining new sequences created by replacing the identified alternative candidate replacement sequence with the other symbol.

6. The computer-readable medium of claim 1, wherein the minimum frequency of occurrence corresponds to a value below which a sequence of symbols cannot have a superior cost savings.

7. The computer-readable medium of claim 1, wherein the minimum frequency of occurrence is computed using a numerical method for converging on a solution to a non-linear problem.

8. The computer-readable medium of claim 7, wherein the numerical method is selected from a group consisting of newton's, secant, and bisection methods.

9. A computer-readable medium having computer executable components for compressing symbols in a string of symbols, comprising:
a symbol sequence picker configured to:
generate sequences of symbols from the string of symbols, wherein the sequences of symbols are ordered according to an associated frequency of occurrence in the string of symbols;
select a current candidate replacement sequence from the ordered sequences of symbols as;
determine a target cost savings and a minimum frequency of occurrence associated with the current candidate replacement sequence, the target cost savings being associated with a reduction in an encoded length of the string of symbols resulting from replacing the candidate replacement sequence with another symbol; and
for other sequences of symbols in the ordered sequence of symbols having an associated frequency of occurrence that is greater than the minimum frequency of occurrence:
identify an alternative candidate replacement sequence, wherein the identified alternative candidate sequence has an associated cost savings that is greater than the target cost savings; and
replace the identified alternative candidate replacement sequence in the string of symbols by the other symbol.

10. The computer-readable medium of claim 9, further comprising distinguishing candidate replacement sequences by segregating patterns of sequences of symbols in the string of symbols.

11. The computer-readable medium of claim 9, wherein the symbol sequence picker is further configured to:
repeat the executable instructions until a predetermined minimum threshold is achieved.

12. The computer-readable medium of claim 11, wherein the predetermined minimum threshold is determined to include at least a sum of bits to encode a grammar rule and the other symbol.

13. The computer-readable medium of claim 9, wherein the sequence of symbols are re-ordered by examining new sequences created by replacing the identified alternative candidate replacement sequence with the single symbol.

14. The computer-readable medium of claim 9, wherein the minimum frequency of occurrence corresponds to a value below which a sequence of symbols cannot have a superior cost savings.

15. The computer-readable medium of claim 9, wherein the minimum frequency of occurrence is computed using a numerical method for converging on a solution to a non-linear problem.

16. The computer-readable medium of claim 15, wherein the numerical method is selected from a group consisting of newton's, secant, and bisection methods.

17. A computer-implemented method for transmitting a compressed data file, comprising:
building a list of decompression information that has relevance to each of a plurality of strings of symbols; wherein building the list of decompression information comprises evaluating the plurality of strings of symbols to identify a candidate replacement sequence of symbols common to the plurality of strings of symbols; generating sequences of symbols from the plurality of strings of symbols; selecting an initial candidate replacement sequence of symbols from the sequences of symbols; determining a target cost savings and a minimum frequency of occurrence associated with the initial candidate replacement sequence of symbols; and analyzing the other sequences of symbols in the sequence of symbols that have a frequency of occurrence that is greater than the minimum frequency of occurrence; and
transmitting the list of decompression information in conjunction with a request for at least one of the plurality of strings of symbols.

18. The computer-implemented method of claim 17, wherein building the list of decompression information comprises ordering the sequences of symbols according to an associated frequency of occurrence in the plurality of strings of symbols.

19. The computer-implemented method of claim 18, wherein evaluating the plurality of strings of symbols, further comprises:
performing actions including:
identifying an alternative candidate replacement sequence of symbols, wherein the identified alternative candidate sequence of symbols has an associated cost savings that is greater than the target cost savings; and
replacing the identified alternative candidate replacement sequence of symbols in the plurality of strings of symbols by another symbol.

20. The computer-implemented method of claim 19, wherein the sequence of symbols are re-ordered by examining new sequences created by replacing the identified alternative candidate replacement sequence with the other symbol.

21. The computer-implemented method of claim 19, wherein the minimum frequency of occurrence corresponds to a value below which a sequence of symbols cannot have a superior cost savings.

22. The computer-implemented method of claim 19, wherein the minimum frequency of occurrence is computed using a selected numerical method for converging on a solution to a non-linear problem.

23. The computer-readable medium of claim 22, wherein the numerical method is selected from a group consisting of newton's, secant, and bisection methods.

24. An apparatus for transmitting a compressed data file, comprising:
   a means for building a list of decompression information, wherein the means for building the list of decompression information comprises:
      a means for generating sequences of symbols from a string of symbols;
      a means selecting a current candidate replacement sequence from the sequences of symbols;
      a means determining a target cost savings and a minimum frequency of occurrence associated with the current candidate replacement sequence, the target cost savings being associated with a reduction in an encoded length in the string of symbols resulting from replacing the candidate replacement sequence with another symbol; and
      a means attempting to identify an alternative candidate replacement sequence when other sequences of symbols in the ordered sequence of symbols have an associated frequency of occurrence that is greater than the minimum frequency of occurrence; and
   a means for transmitting the list of decompression information in conjunction with a request for at least one of the plurality of strings of symbols.

25. The apparatus of claim 24, wherein the means for building the list of decompression information comprises:
   a means for ordering the sequences of symbols according to an associated frequency of occurrence in the plurality of strings of symbols.

* * * * *